US010079058B1

(12) United States Patent
Eleftheriou et al.

(10) Patent No.: US 10,079,058 B1
(45) Date of Patent: Sep. 18, 2018

(54) RESISTIVE MEMORY DEVICE FOR MATRIX-VECTOR MULTIPLICATIONS

(71) Applicant: INTERNATIONAL BUSINESS MACHINES CORPORATION, Armonk, NY (US)

(72) Inventors: Evangelos S. Eleftheriou, Rueschlikon (CH); Manuel Le Gallo-Bourdeau, Zurich (CH); Abu Sebastian, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/685,788

(22) Filed: Aug. 24, 2017

(51) Int. Cl.
| | |
|---|---|
| *G11C 11/00* | (2006.01) |
| *G11C 13/00* | (2006.01) |
| *G06N 3/08* | (2006.01) |
| *G11C 11/54* | (2006.01) |
| *G06G 7/12* | (2006.01) |
| *G06N 3/063* | (2006.01) |

(52) U.S. Cl.
CPC .......... *G11C 13/0021* (2013.01); *G06G 7/12* (2013.01); *G06N 3/063* (2013.01); *G06N 3/088* (2013.01); *G11C 11/54* (2013.01)

(58) Field of Classification Search
CPC ................................................ G11C 13/0002
USPC ....................................................... 365/148
See application file for complete search history.

(56) References Cited

U.S. PATENT DOCUMENTS

| | | | |
|---|---|---|---|
| 9,152,827 B2 | 10/2015 | Linderman et al. | |
| 9,466,362 B2 | 10/2016 | Yu et al. | |
| 2016/0093374 A1* | 3/2016 | Siau ..................... | G11C 13/004 |
| | | | 365/148 |
| 2016/0336064 A1 | 11/2016 | Seo et al. | |

OTHER PUBLICATIONS

Burr et al., "Neuromorphic Computing Using Non-Volatile Memory," Advances in Physics: X, 2017, p. 89-124, vol. 2, Issue 1, Informa UK Limited, Taylor & Francis Group.
Gupta et al., "Deep Learning with Limited Numerical Precision," arXiv CS: Learning, Feb. 9, 2015, p. 1-10, arXiv:1502.02551v1 [cs.LG], Cornell University Library.
(Continued)

*Primary Examiner* — Hoai V Ho
(74) *Attorney, Agent, or Firm* — Erik K. Johnson

(57) ABSTRACT

The invention is notably directed to a device for performing a matrix-vector multiplication of a matrix with a vector. The device comprises a memory crossbar array comprising of row lines, of columns lines and of junctions arranged between the row lines and the column lines. Each junction comprises a programmable resistive memory element. The device comprises a signal generator and a readout circuit. The device is configured to perform a calibration procedure to compensate for conductance variations of the resistive memory elements. The calibration procedure is configured to program a calibration subset of the plurality of resistive memory elements to initial conductance values and to apply a constant calibration voltage to the row lines of the calibration subset. The device is configured to read calibration current values of the column lines of the calibration subset and to derive an estimation of a conductance variation parameter from the calibration current values.

20 Claims, 9 Drawing Sheets

(56) References Cited

OTHER PUBLICATIONS

Hu et al., "Dot-Product Engine for Neuromorphic Computing: Programming 1T1M Crossbar to Accelerate Matrix-Vector Multiplication," DAC '16, Jun. 5-9, 2016, 6 pages, ACM, Austin, TX, USA.

Klavík et al., "Changing Computing Paradigms Towards Power Efficiency," Philosophical Transactions of The Royal Society, 2014, p. 1-13, vol. 372, Issue 2018, Royal Society Publishing.

Papandreou et al., "Drift-Tolerant Multilevel Phase-Change Memory," 3rd IEEE International Memory Workshop (IMW), 2011, 4 Pages.

Sebastian et al., "A Collective Relaxation Model for Resistance Drift in Phase Change Memory Cells," IEEE International Reliability Physics Symposium (IRPS), 2015, p. 1-6.

Wan et al., "Neural Network with Binary Activations for Efficient Neuromorphic Computing," Stanford CS 229 Machine Learning Final Projects, Autumn 2016, 5 Pages, Stanford University.

Xia et al., "Technological Exploration of RRAM Crossbar Array for Matrix-Vector Multiplication," Journal of Computer Science and Technolgy, Jan. 2016, p. 3-19, vol. 31, No. 1, Springer Science+Business Media, LLC & Science Press, China.

\* cited by examiner

RESISTIVE MEMORY DEVICE FOR MATRIX-VECTOR MULTIPLICATIONS

BACKGROUND

Cognitive computing is a promising technology for deriving intelligence and knowledge from huge volumes of data. Today's cognitive computers are usually based on the Von Neumann architecture in which the computing and the memory units are separated. Cognitive computing is inherently data-centric, meaning that huge amounts of data need to be shuttled back and forth at high speeds. As the Von Neumann architecture is rather inefficient for such a task, it is becoming increasingly clear that other architectures are desired to build efficient cognitive computers, in particular architectures where memory and logic coexist in some form.

Memcomputing is a key non-Von Neumann approach being researched. A key element in this novel computing paradigm is a high-density, low-power, variable state, programmable and non-volatile memory device.

A fundamental computational primitive is a matrix-vector multiplication. This primitive is of particular interest as it forms the basis of several linear algebraic operations and it is one of the most commonly used mathematical operations in science and engineering. A matrix is usually represented by a two-dimensional array of matrix elements and a vector by a one-dimensional array of vector elements. A matrix may be considered as array of vectors. Hence a matrix-vector multiplication can be generalized to a matrix-matrix multiplication and to a vector-vector multiplication.

However, many challenges remain to be solved in order to perform accurate matrix-vector computations in an array of memory devices. One of them is inherent device conductance variations over time which can come from temperature changes, temporal drift or read disturb. Such conductance variations may lead to systematic errors in the multiplication results.

Accordingly, there is a need for new and improved memcomputing devices, in particular for memcomputing devices that can perform matrix-vector multiplications.

SUMMARY

According to a first aspect, the invention is embodied as a device for performing a matrix-vector multiplication of a matrix with a vector. The device comprises a memory crossbar array comprising a plurality of row lines, a plurality of columns lines and a plurality of junctions arranged between the plurality of row lines and the plurality of column lines. Each junction comprises a programmable resistive memory element. The device further comprises a signal generator configured to apply programming signals to the resistive memory elements to program conductance values for the matrix-vector multiplication and a readout circuit configured to apply read voltages to the row lines of the memory crossbar array and to read out current values of column lines of the memory crossbar array. The device is configured to perform a calibration procedure to compensate for conductance variations of the resistive memory elements. The calibration procedure is configured to program a calibration subset of the plurality of resistive memory elements to initial conductance values. The calibration procedure is further configured to apply a constant calibration voltage to the row lines of the calibration subset and to read calibration current values of the column lines of the calibration subset. The calibration procedure is further configured to derive an estimation of a conductance variation parameter from the calibration current values.

According to an embodiment of another aspect of the invention a method for calibrating a device for performing a matrix-vector multiplication of a matrix with a vector is provided. The device comprises a memory crossbar array comprising a plurality of row lines, a plurality of columns lines and a plurality of junctions arranged between the plurality of row lines and the plurality of column lines. Each junction comprises a programmable resistive memory element. The device further comprises a signal generator and a readout circuit. The method comprises performing a calibration procedure. The calibration procedure comprises programming a calibration subset of the plurality of resistive memory elements to initial conductance values. The calibration procedure further comprises applying a constant calibration voltage to the row lines of the calibration subset, reading calibration current values of the column lines of the calibration subset and deriving an estimation of a conductance variation parameter from the calibration current values.

According to another aspect a design structure is provided. The design structure is tangibly embodied in a machine readable medium for designing, manufacturing, or testing an integrated circuit. The design structure comprises a device for performing a matrix/vector multiplication of a matrix with a vector. The device comprises a memory crossbar array comprising a plurality of row lines, a plurality of columns lines and a plurality of junctions arranged between the plurality of row lines and the plurality of column lines. Each junction comprises a programmable resistive memory element. The device further comprises a signal generator configured to apply programming signals to the resistive memory elements to program conductance values for the matrix-vector multiplication and a readout circuit configured to apply read voltages to the row lines of the memory crossbar array and to read out current values of column lines of the memory crossbar array. The device is configured to perform a calibration procedure to compensate for conductance variations of the resistive memory elements. The calibration procedure is configured to program a calibration subset of the plurality of resistive memory elements to initial conductance values. The calibration procedure is further configured to apply a constant calibration voltage to the row lines of the calibration subset, read calibration current values of the column lines of the calibration subset and derive an estimation of a conductance variation parameter from the calibration current values.

Embodiments of the invention will be described in more detail below, by way of illustrative and non-limiting examples, with reference to the accompanying drawings.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
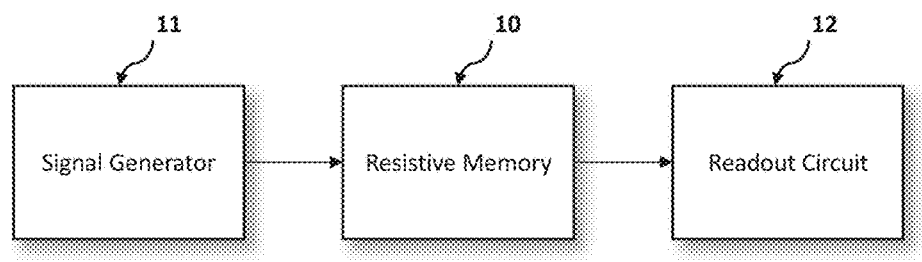
FIG. 1 is a simplified schematic block diagram of a device for performing a multiplication of a matrix with a vector according to an embodiment of the invention.

In reference to FIGS. 1-9, some general aspects and terms of embodiments of the invention are described.

According to embodiments of the invention, a resistive memory element may be defined as a memory element whose electrical resistance can be changed by applying an electrical programming signal to the resistive memory element. The electrical programming signal may be, for example, a current flowing through the resistive memory element or an electrical voltage applied to the resistive memory element. The current or voltage may be, for example, applied to the resistive memory element in the form of pulses. As a result, the electrical resistance of a resistive memory element depends on the history of current that may have been previously flown through the memory element or the history of the electric signal that had been applied to the resistive memory element.

Resistive memory elements may be based on a physical phenomenon occurring in a material that changes its resistance under action of a current or electric field. The change may be non-volatile and reversible. Several classes of known resistive memory elements may range from metal oxides to chalcogenides. Typical resistive memory elements may include metal/insulator/metal structures where the metallic components serve as the electrodes and the insulator is a resistive switching material (e.g., a chalcogenide). These resistive memory elements may exhibit good performance in terms of power consumption, integration density potential, retention, and endurance.

Embodiments of the invention may provide a way to do inexact fast matrix multiplication with high accuracy. The result from this multiplication may preferably be used in algorithms that do not require high precision for multiplication tasks. Such an algorithm that could be used for the post-processing of the results of the multiplication according to embodiments of the invention, for example, an algorithm disclosed by Klavik et al. in "Changing Computing Paradigms Towards Power Efficiency," Proc. Royal Society A., 2014. The multiplication performed according to embodiments of the invention can be fast, low-power and may be scalable to matrix sizes of 10000×10000 and beyond.

Furthermore, embodiments of the invention may propose a calibration procedure that can be used in order to prevent systematic errors in matrix-vector multiplication results due to conductance variations of the resistive memory elements. The proposed procedure may estimate the conductance variations directly from the memory elements without any assumptions on how the conductance is changing. The procedure may be implemented in any memory crossbar array at a very low complexity.

Embodiments of the invention may bring significant power or speed advantages compared to the conventional Von-Neumann approach where the data has to be shuttled back and forth between a central processing unit (CPU) and the memory.

As a matrix-vector multiplication can be generalized to a matrix-matrix multiplication and to a vector-vector multiplication, the device and the methods according to embodiments of the invention can also be used to perform matrix-matrix multiplications and vector-vector multiplications.

FIG. 1 is a simplified schematic block diagram of a device 100 for performing a multiplication of a matrix with a vector. The device 100 comprises a resistive memory 10 having a plurality of resistive memory elements. Furthermore, a signal generator 11 is provided. The signal generator 11 may be configured to apply electrical programming signals to the resistive memory elements of the resistive memory 10. The signal generator 11 may be comprised of circuitry for programming the resistive memory cells during data write or programming operations such that a multiplication of a matrix with a vector can be performed. During these write operations, the signal generator 11 can address individual memory cells by applying appropriate control signals to an array of row lines and column lines in the memory 10. The row lines and column lines may also be denoted as word and bit lines. The signal generator 11 may be configured to receive a matrix A as input and to apply programming signals to the memory elements to program conductance values of the resistive memory elements for a matrix-vector multiplication. The conductance values may represent matrix values of the matrix that shall be multiplied with the vector.

In addition, the device 100 comprises a readout circuit 12 that may be configured to read out resistance values of the resistive memory elements during data read operations. The device 100 may be configured to apply read out voltages to the rows of the memory crossbar array. The read out voltages may represent vector elements of the vector that shall be multiplied with the matrix. The device may further be configured to read out current values of columns of the memory array. The current values may represent result values of vector elements of a result vector of the multiplication.

The memory 10 may be generally any kind of resistive memory as described above. In particular it may be a phase change memory (PCM) or a resistive random access memory (RRAM). In the following it may be assumed that the resistive memory 10 is embodied as PCM. Accordingly, the resistive memory 10 may be comprised of a plurality of PCM cells as resistive memory elements. The PCM cells of memory 10 may be comprised of s=2 or s>2 programmable resistance states, the latter providing multilevel operation. The s programmable resistance-states may correspond to different relative proportions of the amorphous and crystalline phases within the PCM material of the cell. These states may include a high-resistance, fully-amorphous RESET state, a low-resistance, fully-crystalline SET state, and a number of intermediate states corresponding to increasing size of the crystalline phase within the otherwise amorphous PCM material. The s programmable cell-states may be defined in terms of predetermined reference values, or ranges of values, of the resistance metric used for read detection by the readout circuit 12.

To perform a matrix-vector multiplication, the PCM cells may be programmed according to embodiments in a kind of write operation. More particularly, the signal generator 11 may apply a voltage to the cell via the column lines and row lines such that the resulting programming signal sets the cell to a state (e.g., conductance value) that may represent a matrix element of the matrix that shall be multiplied with the vector. In a read operation, lower read voltages may be applied to the row lines. Then the resulting column current values of the column lines are read or measured to obtain the result vector.

Figure 2:
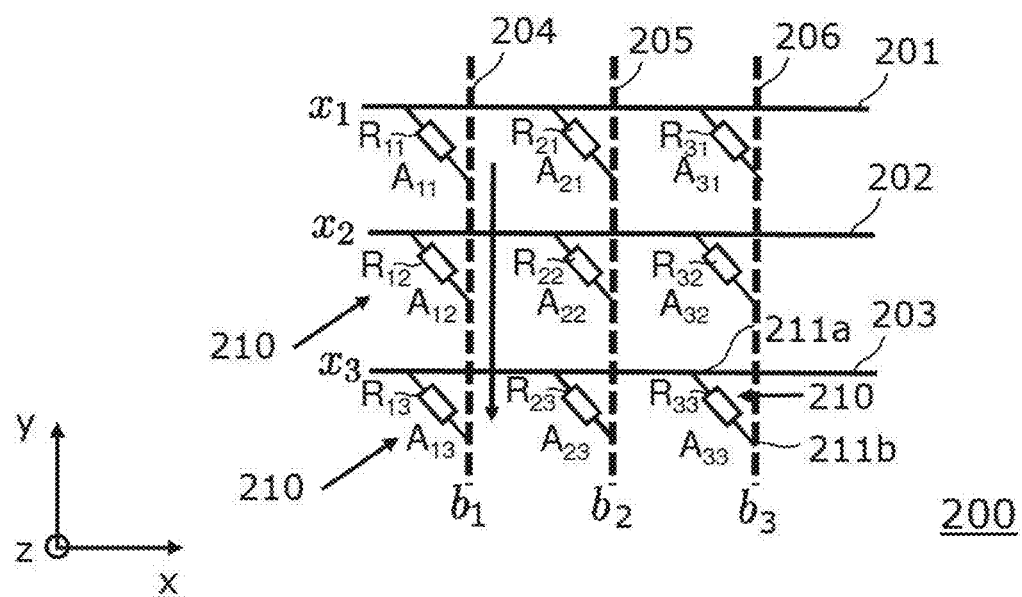
FIG. 2 illustrates an example of matrix-vector multiplication according to an embodiment of the invention.

FIG. 2 illustrates an example of matrix multiplication according to an embodiment of the invention. The matrix multiplication uses Ohm's law and Kirchhoff's law in a resistive memory crossbar array.

According to the illustrated example, a matrix A of size 3×3 shall be multiplied with a vector x and the result is a product or result vector b:

$$\begin{bmatrix} A_{11} & A_{12} & A_{13} \\ A_{21} & A_{22} & A_{23} \\ A_{31} & A_{32} & A_{33} \end{bmatrix} \begin{bmatrix} x_1 \\ x_2 \\ x_3 \end{bmatrix} = \begin{bmatrix} b_1 \\ b_2 \\ b_3 \end{bmatrix}.$$

Accordingly, the matrix A comprises a first column consisting of the matrix elements $A_{11}$, $A_{21}$ and $A_{31}$, a second column consisting of the matrix elements $A_{12}$, $A_{22}$ and $A_{32}$ and a third column consisting of the matrix elements $A_{13}$, $A_{23}$ and $A_{33}$. The vector x comprises the vector elements $x_1$, $x_2$ and $x_3$.

For such a multiplication of the matrix A with the size 3×3, the resistive memory 10 may be comprised of a memory crossbar array 200 of a corresponding size 3×3.

The memory crossbar array 200 may be comprised of 3 row lines 201, 202 and 203 and three column lines 204, 205 and 206. The three row lines 201, 202 and 203 may be arranged above the three column lines 204, 205 and 206 which is indicated by dotted lines. More particularly, the row lines 201, 202 and 203 extend in a first x-y-plane and the three column lines extend in a second x-y plane, wherein the first x-y plane may be arranged in the vertical z-direction above the second x-y-plane.

The three row lines 201, 202 and 203 and the three column lines 204, 205 and 206 may be connected to each other via vertical junctions 210. The junctions 210 may extend in the vertical z-direction between upper cross points 211*a* of the row lines 201-203 and lower cross points 211*b* of the column lines 204-206.

Each junction 210 may be comprised of a serial arrangement of a resistive memory element and a transistor. For ease of illustration, the transistors are not shown in FIG. 2.

More particularly, the crossbar array 200 may be comprised of 9 resistive memory elements embodied as PCM cells. The column line 204 may be comprised of resistive memory elements $R_{11}$, $R_{12}$ and $R_{13}$, the column line 205 comprises the memory elements $R_{21}$, $R_{22}$ and $R_{23}$ and the column line 206 the memory elements $R_{31}$, $R_{32}$ and $R_{33}$.

In order to perform the matrix-vector multiplication of the above matrix, the signal generator 11 may apply programming signals, in particular current pulses, to the resistive memory elements and thereby programs the conductance values for the matrix-vector multiplication.

More particularly, the conductance values of the resistive memory elements may represent matrix values of the matrix of the matrix-vector multiplication. Accordingly, the conductance of the resistive memory element $R_{11}$ may be programmed to the matrix value $A_{11}$, the conductance of the resistive memory element $R_{12}$ may be programmed to the matrix value $A_{12}$, or more generally the conductance of the resistive memory Rij may be programmed to a corresponding matrix value Aij.

Then the readout circuit 12 may apply read voltages to the row lines 201, 202 and 203. More particularly, the readout circuit 12 may apply a read voltage $X_1$ to the row line 201, a read voltage $X_2$ to the row line 202 and a read voltage $X_3$ to the row line 203. Hence the read voltages may represent vector values of the vector of the matrix-vector multiplication.

Furthermore, the readout circuit 12 may read out current values of the column lines 204, 205 and 206. As an example, the readout circuit 12 reads out a current value $b_1$ from the column line 204, which is the sum of three multiplications, namely:

$$b_1 = A_{11}x_1 + A_{12}x_2 + A_{13}x_3.$$

Accordingly, the readout circuit 12 may read out a current value $b_2$ from the column line 205 and a current value $b_3$ from the column line 206. The current values may represent the result values of the vector elements of the product vector b.

Figure 3:
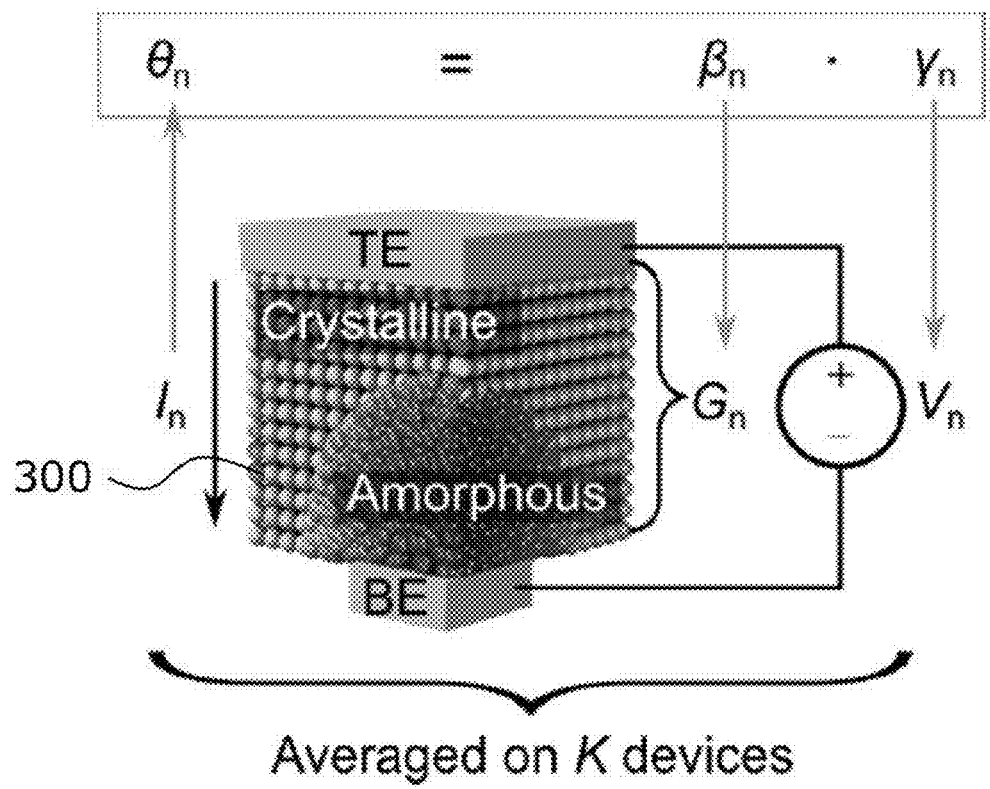
FIG. 3 illustrates an exemplary embodiment of a scalar multiplication to be performed by a phase change memory cell.

FIG. 3 illustrates an exemplary embodiment of a scalar multiplication that may be performed by a PCM cell 300. Such a scalar multiplication forms the basis of the matrix-vector multiplication performed according to embodiments of the invention. Let $\theta_n = \beta_n \cdot \gamma_n$, where $\beta_n$ and $\gamma_n$ are numbers generated uniformly in [0,1]. $\beta_n$ is mapped to an effective conductance $G_n$, and $\gamma_n$ to a voltage $V_n$. As the current in the PCM cell 300 may be a slightly non-linear function of the voltage, the analogue scalar multiplication may be expressed to follow a "pseudo" OHM's law, namely:

$$I_n \approx \alpha G_n \cdot f(V_n).$$

In this equation, $\alpha$ may be a time dependent conductance variation parameter and $f$ may be a function, for example, a polynomial function that approximates the current-voltage characteristics of the PCM cell 300. The PCM cell 300 may be programmed to the effective conductance $G_n$ by an iterative program and verify procedure. Then the readout circuit 12 may apply a read voltage $V_n$ and readout the current $I_n$. Finally, the current $I_n$ may be converted back to approximate the value $\hat{\theta}_n$, representing the result of the scalar multiplication.

According to preferred embodiments, an averaging of the result over K memory elements/PCM cells may be performed.

One problem may be the estimation of the conductance variation parameter $\alpha$, which is a priori unknown. Moreover, the conductance G may in reality not be constant in time and may vary due to conductance drift, read disturb, or temperature variations.

Furthermore, according to some embodiments the resistive memory elements may be emulated by a capacitor and a FET device. The conductance of such an arrangement of a capacitor and a FET device will vary because of capacitor leakage. The calibration procedure according to embodiments of the invention may be applied to correct for this effect as well.

Figure 4:
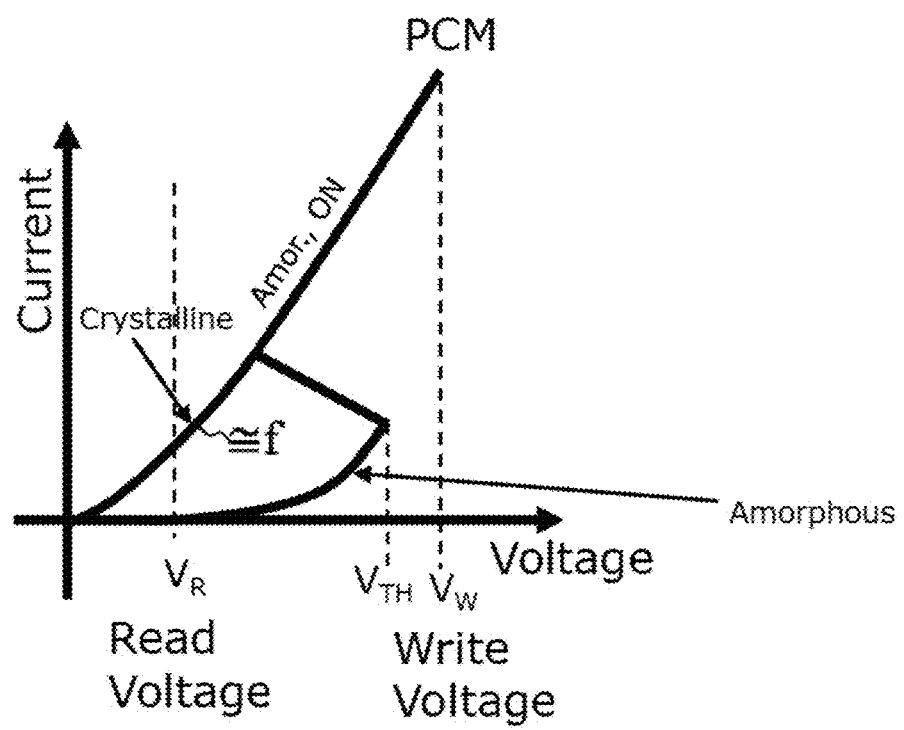
FIG. 4 is a schematic illustration of the current/voltage characteristics of the material components of the phase change memory cell of FIG. 3.

FIG. 4 is a schematic illustration of the current/voltage (i.e., resistance) characteristics of the material components of the memory cell 300 of FIG. 3. The solid lines may indicate variation of current with voltage for the PCM material, starting from the fully-crystalline SET state (i.e., upper curve) and also the fully-amorphous RESET state (i.e., lower curve). These two curves may reflect the large (e.g., typically 3 orders of magnitude) variation in resistivity between the crystalline and amorphous phases. The amorphous phase may exhibit a non-linear characteristic with a threshold switching phenomenon that is field induced. At a certain threshold voltage $V_{TH}$, this phase may switch to a very low "ON-state" resistance corresponding to that of the crystalline PCM material. The cell programming (i.e., write) voltage may be selected to be above this threshold voltage as indicated.

As can be seen in FIG. 4, the current in the read mode is a slightly non-linear function of the voltage, which may be approximated by the function $f$ as described above.

Figure 5:
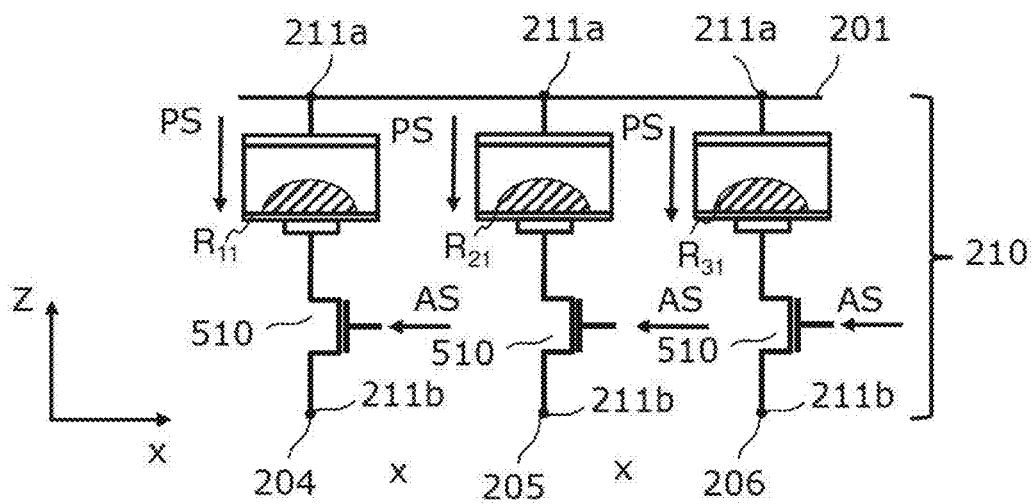
FIG. 5 shows an exemplary cross sectional view/side view of a memory crossbar array according to an embodiment of the invention.

FIG. 5 shows a schematic illustration 500 of a cross sectional/side view of the memory crossbar array 200 of FIG. 2.

More particularly, it shows the row line 201 and junctions 210 that connect the row line 201 with the column lines 204, 205 and 206. Each of the junctions 210 may be comprised of a programmable resistive element ($R_{11}$, $R_{21}$ and $R_{31}$) and a transistor 510. The transistors 510 may be embodied as access transistors. By applying an access signal AS to the transistors 510, the respective resistive memory element may be individually addressed and accessed and programming signals PS may be individually applied to the respective memory element to program it to a desired resistance/conductance.

Figure 6:
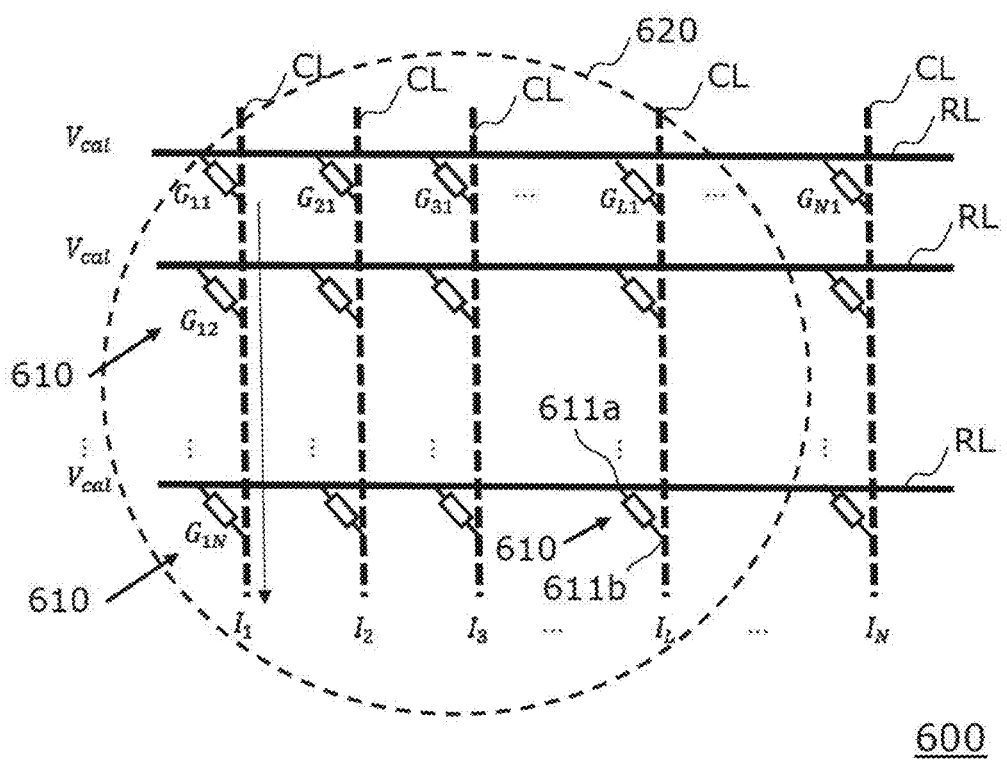
FIG. 6 shows a memory crossbar array comprising a calibration subset of memory elements.

FIG. 6 shows a memory crossbar array 600 of a device according to an embodiment of the invention. The memory crossbar array 600 may be comprised of a plurality of N row lines, commonly denoted as RL, and a plurality of N column lines, commonly denoted as CL. The column lines CL may again be illustrated by dotted lines. The row lines RL may be arranged above the three column lines CL. More particularly, the row lines RL may extend in a first x-y-plane and the column lines CL may extend in a second x-y plane, wherein the first x-y plane may be arranged in the vertical z-direction above the second x-y plane.

The row lines RL and the column lines CL may be connected to each other via vertical junctions 610. The junctions 610 may extend in the vertical z-direction between upper cross points 611a of the row lines RL and lower cross points 611b of the column lines CL.

Each junction 610 may be comprised of a serial arrangement of a resistive memory element and a transistor. For ease of illustration, the transistors are not shown in FIG. 6.

More particularly, the crossbar array 600 may be comprised of resistive memory elements Gij, wherein I=1, 2 ... N and j=1, 2 ... N. In the following Gij may commonly denote the respective resistive element as well as its conductance.

The crossbar array 600 may be configured to perform a calibration procedure to compensate for conductance variations of the resistive memory elements Gij. The calibration procedure may not be performed for all of the resistive memory elements Gij, but only for a subset 620 of the resistive memory elements Gij. The subset 620 comprises the resistive elements Gij, wherein I=1, 2 ... L and j=1, 2 ... N and wherein L<N. The calibration subset 620 may be comprised of preferably less than 20% of the total number of memory elements of the crossbar array 600. According to embodiments, the calibration subset 620 may be comprised of between 1,000 and 20,000 resistive memory elements. According to embodiments, the whole crossbar array 600 may be comprised of 1,000,000 or more resistive memory elements.

Figure 7:
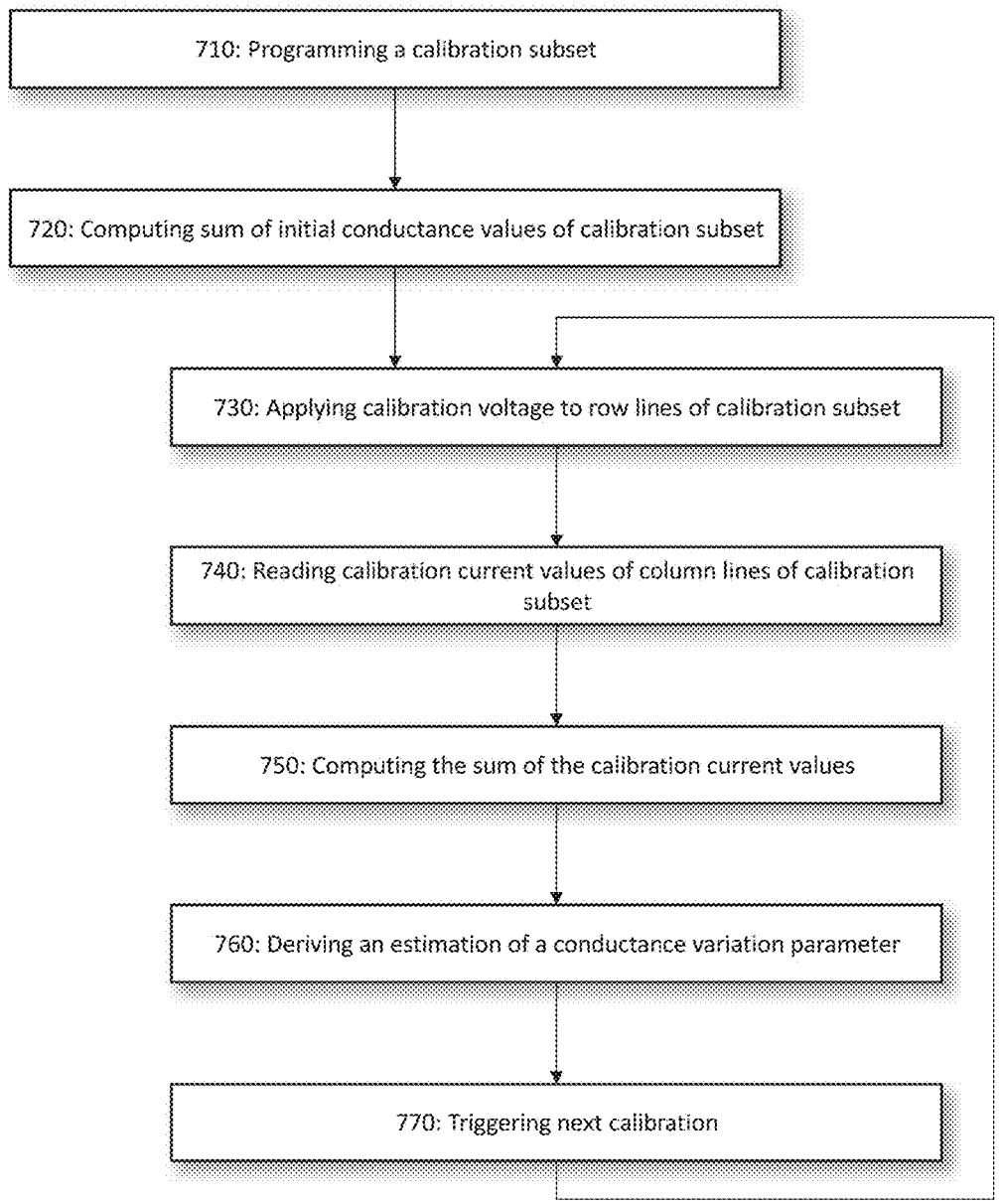
FIG. 7 shows a flowchart of method steps of a method for performing a calibration to compensate for variations of the conductance of the resistive elements of a memory crossbar array.

FIG. 7 shows a flowchart 700 of method steps of a method for performing a calibration to compensate for variations of the conductance Gij of the resistive elements Gij of the crossbar array 600.

The calibration procedure performed by the crossbar array 600 may be described with reference to FIG. 6 for the device features and FIG. 7 for the method steps.

For the calibration procedure, according to embodiments of the invention, it may be assumed that the conductance G of the resistive memory elements varies as follows:

$$G(t)=G_0 \cdot h(t),$$

wherein h(t) may be any function of time. Furthermore, it may be assumed that h(t) is the same for all resistive memory elements in the memory crossbar array 600 and independent of $G_0$.

Therefore, the variation of the current of the resistive memory element with time may be globally described as a change in α, i.e., $$I \approx \alpha(t) G_0 f(V); \alpha(t) \equiv \alpha_0 \cdot h(t).$$

A calibration procedure according to embodiments may comprise of estimating (t) in order to prevent errors in the multiplication results coming from conductance variations.

At a step 710, the resistive memory elements of the calibration subset 620 of the plurality of resistive memory elements Gij are programmed to initial conductance values $G_{0ij}$. The initial conductance values $G_{0ij}$ may be the conductance values of the corresponding resistive elements at an initial time $t_o$. In other words, the calibration subset 610 may encode the matrix $G_{0ij}$. The programming to the initial conductance values may be performed by an iterative program and verify procedure.

Then, at a step 720, the device (e.g., device 100 of FIG. 1) computes the sum $S_1$ of the initial conductance values $G_{0ij}$ of the initial programmed conductances of the calibration subset, which may be expressed by an equation as follows:

$$S_1 = \sum_{i=1}^{L} \sum_{j=1}^{N} G_{0ij}.$$

The sum $S_1$ may only need to be computed once and can then be stored by the device 100 and used subsequently for the further calibration steps.

At a further step 730, the device, a readout circuit (e.g., the readout circuit 12 of FIG. 1) may apply a constant calibration voltage $Vc_{al}$ to the row lines RL of the crossbar array.

At a step 740, the readout circuit 12 reads calibration current values $I_1, I_2, I_3, \ldots I_L$ of the L column lines of the calibration subset 620.

At a step 750, the device computes the sum $S_2$ of the calibration current values $I_1, I_2, I_3, \ldots I_L$:

$$S_2 = \sum_{i=1}^{L} I_i.$$

Then, at a step 760, the device 100 computes an estimation of the conductance variation parameter α from the calibration current values as follows:

$$\alpha = \frac{\sum_{i=1}^{L} I_i}{f(V_{cal})\left(\sum_{i=1}^{L}\sum_{j=1}^{N} G_{0ij}\right)};$$

wherein $f$ may be an approximation function, in particular a polynomial function, that approximates the current-voltage characteristic of the resistive memory elements in the read mode as explained with reference to FIGS. 3 and 4.

As can be seen in the above formula, the conductance variation parameter α may be derived from the ratio of the sum of the calibration current values $$\sum_{i=1}^{L} I_i$$

to the sum of the initial conductance values $$\sum_{i=1}^{L}\sum_{j=1}^{N} G_{0ij}.$$

The steps 730, 740, 750 and 760 may be performed at regular predefined intervals.

As an example, at a step 770, a timer may be set to initiate the next run of the calibration procedure. Furthermore, the calibration procedure may be started at predefined events (e.g., if a decreasing computation accuracy has been detected).

The number of resistive elements of the calibration subset 620 can be chosen to be small, enough to get sufficient statistics. Moreover, the sum $S_1$ of the initial conductance values $G_{0ij}$ may only need to be computed one time. Therefore, by repeating the calibration procedure periodically during an experiment, changes in α with time can be accounted for to prevent errors in the multiplication results.

As explained above, according to embodiments the conductance variations may be estimated directly from the crossbar memory array without any assumptions on how the conductance is changing.

Figure 8:
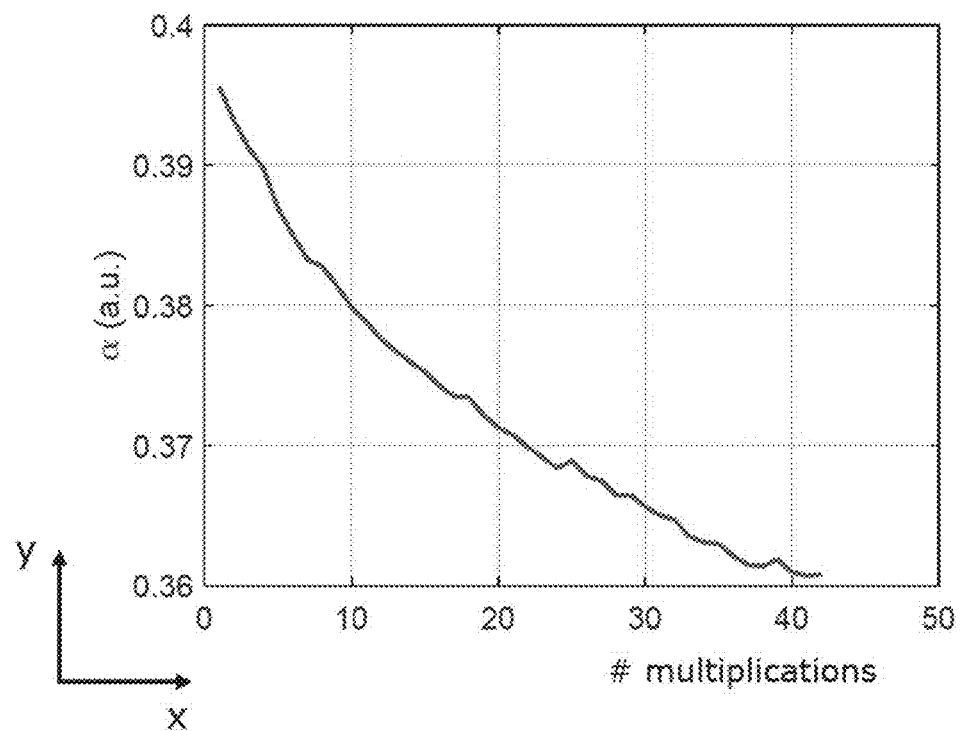
FIG. 8 shows exemplary experimental results of an implementation of a calibration procedure according to an embodiment of the invention.

FIG. 8 shows exemplary experimental results of an implementation of a calibration procedure according to an embodiment of the invention. The experiment was performed on a phase change memory crossbar array, whereby multiple matrix-vector multiplications are done with 80,000 resistive memory elements. The y-axis denotes the conductance variation parameter α in arbitrary units and the x-axis the number of matrix-vector multiplications performed. The calibration was done at every iteration using M=10,000 resistive memory elements for the calibration subset. As can be seen, the conductance variation parameter α could be estimated accurately for the whole duration of the experiment.

Figure 9:
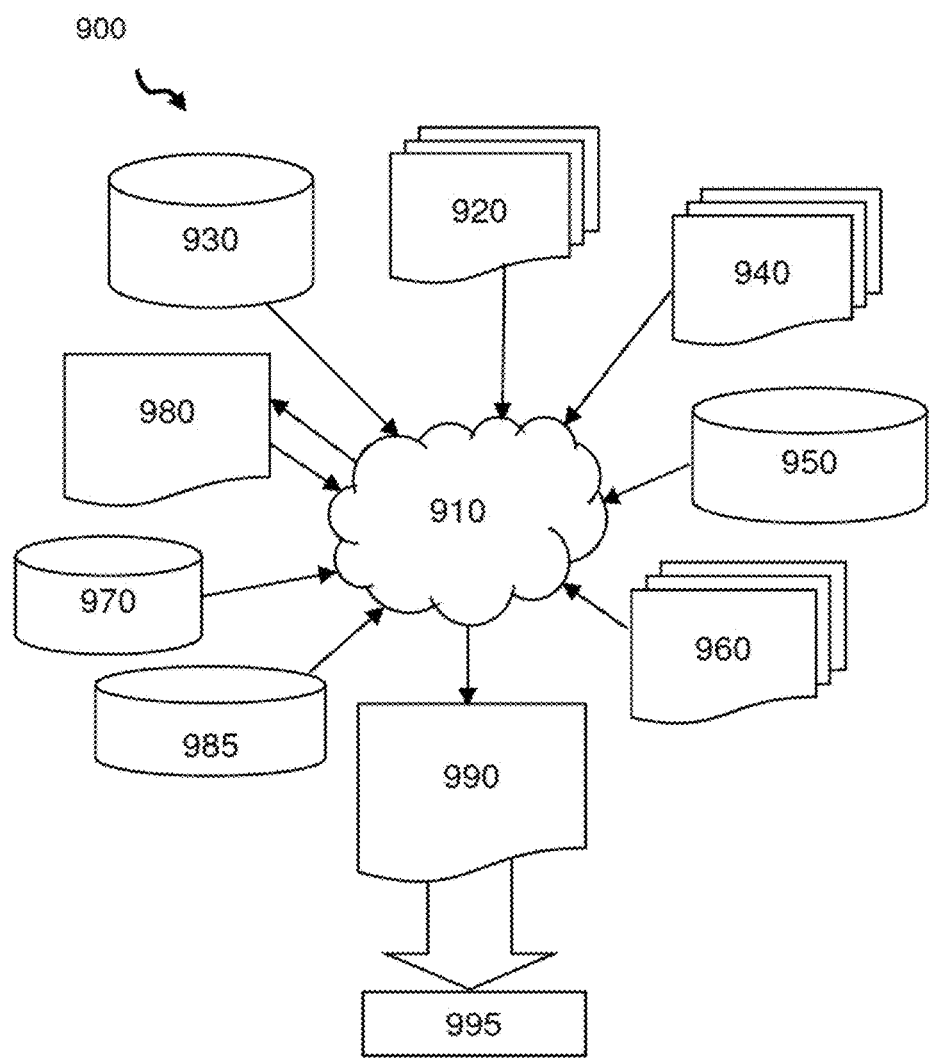
FIG. 9 shows a block diagram of an exemplary design flow.

FIG. 9 shows a block diagram of an exemplary design flow 900 used for example, in semiconductor IC logic design, simulation, test, layout, and manufacture. Design flow 900 includes processes, machines or mechanisms for processing design structures or devices to generate logically or otherwise functionally equivalent representations of the design structures or devices described above and shown (e.g., in FIGS. 1, 2 3, 5 and 6). The design structures processed or generated by design flow 900 may be encoded on machine-readable transmission or storage media to include data or instructions that when executed or otherwise processed on a data processing system generate a logically, structurally, mechanically or otherwise functionally equivalent representation of hardware components, circuits, devices or systems. Machines include, but are not limited to, any machine used in an IC design process, such as designing, manufacturing, or simulating a circuit, component, device, or system. For example, machines may include lithography machines, machines or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 900 may vary depending on the type of representation being designed. For example, a design flow 900 for building an application specific IC (i.e., ASIC) may differ from a design flow 900 for designing a standard component or from a design flow 900 for instantiating the design into a programmable array. For example, a programmable gate array (PGA) or a field programmable gate array (FPGA) offered by Altera® Inc. (Altera based trademarks and logos are trademarks or registered trademarks of Intel Corporation and/or its affiliates) or Xilinx® Inc. (Xilinx based trademarks and logos are trademarks or registered trademarks of Xilinx corporation and/or its affiliates).

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also, or alternatively, be comprised of data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1, 2, 3, 5 and 6. As such, design structure 920 may be comprised of files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher-level design languages such as C or C++.

Design process 910 preferably employs and may incorporate hardware and/or software modules for synthesizing, translating, or otherwise processing a design/simulation functional equivalent of the components, circuits, devices, or logic structures shown in FIGS. 1-6 and 8 to generate a Netlist 980 which may contain design structures such as design structure 920. Netlist 980 may comprise, for example, of compiled or otherwise processed data structures representing a list of wires, discrete components, logic gates, control circuits, I/O devices or models that describe the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations.

Design process 910 employs and incorporates logic and physical design tools such as HDL compilers and simulation model build tools to process design structure 920 together with some or all of the depicted supporting data structures along with any additional mechanical design or data, if applicable, to generate a second design structure 990. Design structure 990 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2, 3, 5 and 6. In one embodiment, design structure 990 may comprise a compiled, executable HDL simulation model that functionally simulates the devices shown in FIGS. 1-6, 8 and 10.

Design structure 990 may also employ a data format used for the exchange of layout data of integrated circuits and/or symbolic data format (e.g., information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2, 3, 5 and 6. Design structure 990 may then proceed to a stage 995 where, for example, design structure 990 proceeds to tape-out, is released to manufacturing, is released to a mask house, is sent to another design house or is sent back to the customer.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. In general, modifications described for one embodiment may be applied to another embodiment as appropriate.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A device for performing a matrix-vector multiplication of a matrix with a vector, the device comprising:
 a memory crossbar array comprising
  a plurality of row lines;
  a plurality of columns lines;
  a plurality of junctions arranged between the plurality of row lines and the plurality of column lines, wherein each junction comprises a programmable resistive memory element;
 a signal generator configured to
  apply programming signals to the resistive memory elements to program conductance values for the matrix-vector multiplication;
 a readout circuit configured to
  apply read voltages to the row lines of the memory crossbar array;
  read out current values of column lines of the memory crossbar array;
 wherein
  the device is configured to perform a calibration procedure to compensate for conductance variations of the resistive memory elements, the calibration procedure being configured to:

program a calibration subset of the plurality of resistive memory elements to initial conductance values;

apply a constant calibration voltage to the row lines of the calibration subset;

read calibration current values of the column lines of the calibration subset; and derive an estimation of a conductance variation parameter from the calibration current values.

2. A device according to claim 1, wherein
the conductance values represent matrix values of the matrix of the matrix-vector multiplication;
the read voltages represent vector values of the vector of the matrix-vector multiplication; and
the current values represent result values of vector elements of a product vector of the matrix-vector multiplication.

3. A device according to claim 1, wherein the device is configured to perform the calibration procedure at regular predefined intervals.

4. A device according to claim 1, wherein the plurality of junctions comprises a serial arrangement of a resistive memory element and a transistor.

5. A device according to claim 1, wherein
the device is configured to
compute the sum of the initial conductance values of the resistive memory elements of the calibration subset;
compute the sum of the calibration current values of the column lines of the calibration subset; and
estimate the conductance variation parameter from the ratio of the sum of the calibration current values to the sum of the initial conductance values.

6. A device according to claim 1, wherein the device is configured to
encode the initial conductance values of the subset by a matrix $G_{0ij}$;
derive the conductance variation parameter $\alpha$ as follows:

$$\alpha = \frac{\sum_{i=1}^{L} I_i}{f(V_{cal})\left(\sum_{i=1}^{L}\sum_{j=1}^{N} G_{0ij}\right)};$$

wherein
L is the number of columns of the calibration subset;
N is the number of rows of the calibration subset;
$I_i$ is the calibration current value of a column i;
f is an approximation function that approximates the current-voltage characteristic; and
$V_{cal}$ is the constant calibration voltage.

7. A device according to claim 1, wherein the calibration subset of memory elements comprises less than 20% of the total number of memory elements of the memory array.

8. A device according to claim 1, wherein the calibration subset of memory elements comprises between 1,000 and 20,000 memory elements.

9. A device according to claim 1, wherein the device is configured
to perform multiple runs for the matrix-vector multiplication; and
to perform an averaging of result values of the multiple runs.

10. A device according to claim 1, wherein the resistive memory elements are one of Phase change memory (PCM) elements, Conductive bridge resistive memory elements, Metal-oxide resistive random access memory (RRAM) elements, Magneto-resistive random access memory (MRAM) elements, Ferroelectric random access memory (FeRAM) elements, optical memory elements, and a system device, the system device comprising transistors, resistors, capacitors, and/or inductors configured to jointly emulate a behavior of a resistive memory element.

11. A device according to claim 10, wherein the resistive memory elements are phase change memory elements and wherein the device is configured to:
apply a Reset-pulse to the phase change memory elements in order to bring the phase change memory elements in the amorphous state;
apply as programming signals current pulses to the phase change memory elements that heat the phase change memory elements above the crystallization temperature, thereby lowering the conductance of the phase change memory elements to a desired conductance value.

12. A device according to claim 1, wherein the signal generator is configured to program the conductance values of the resistive memory elements by an iterative program and verify procedure.

13. A method for calibrating a device for performing a matrix-vector multiplication of a matrix with a vector, the device further comprising:
a memory crossbar array comprising a plurality of row lines, a plurality of columns lines and a plurality of junctions arranged between the plurality of row lines and the plurality of column lines, wherein each junction comprises a programmable resistive memory element;
a signal generator; and
a readout circuit;
the method comprising performing a calibration procedure comprising
programming a calibration subset of the plurality of resistive memory elements to initial conductance values;
applying a constant calibration voltage to the row lines of the calibration subset;
reading calibration current values of the column lines of the calibration subset; and
deriving an estimation of a conductance variation parameter from the calibration current values.

14. A method as claimed in claim 13, further comprising; performing the calibration procedure at regular predefined intervals.

15. A method as claimed in claim 13, further comprising:
computing the sum of the initial conductance values of the resistive memory elements of the calibration subset;
computing the sum of the calibration current values of the column lines of the calibration subset; and
estimating the conductance variation parameter from the ratio of the sum of the calibration current values to the sum of the initial conductance values.

16. A method as claimed in claim 13, further comprising:
encoding the initial conductance values of the subset by a matrix $G_{0ij}$;
deriving the conductance variation parameter $\alpha$ as follows:

$$\alpha = \frac{\sum_{i=1}^{L} I_i}{f(V_{cal})\left(\sum_{i=1}^{L}\sum_{j=1}^{N} G_{0ij}\right)};$$

wherein
- L is the number of columns of the calibration subset;
- N is the number of rows of the calibration subset;
- $I_i$ is the calibration current value of a row i;
- f is an approximation function that approximates the current-voltage characteristic; and
- $V_{cal}$ is the constant calibration voltage.

17. A design structure tangibly embodied in a machine readable medium for designing, manufacturing, or testing an integrated circuit, the design structure comprising:
   a device for performing a matrix-vector multiplication of a matrix with a vector, the device comprising:
   a memory crossbar array comprising:
      a plurality of row lines;
      a plurality of columns lines;
      a plurality of junctions arranged between the plurality of row lines and the plurality of column lines, wherein each junction comprises a programmable resistive memory element;
   a signal generator configured to
      apply programming signals to the resistive memory elements to program conductance values for the matrix-vector multiplication;
   a readout circuit configured to
      apply read voltages to the row lines of the memory crossbar array;
      read out current values of column lines of the memory crossbar array;
   wherein
      the device is configured to perform a calibration procedure to compensate for conductance variations of the resistive memory elements, the calibration procedure being configured to:
      program a calibration subset of the plurality of resistive memory elements to initial conductance values;
      apply a constant calibration voltage to the row lines of the calibration subset;
      read calibration current values of the column lines of the calibration subset; and
      derive an estimation of a conductance variation parameter from the calibration current values.

18. A design structure according to claim 17, wherein
   the conductance values represent matrix values of the matrix of the matrix-vector multiplication;
   the read voltages represent vector values of the vector of the matrix-vector multiplication; and
   the current values represent result values of vector elements of a product vector of the matrix-vector multiplication.

19. A design structure according to claim 17, wherein the device is configured to perform the calibration procedure at regular predefined intervals.

20. A design structure according to claim 17, wherein the plurality of junctions comprise a serial arrangement of a resistive memory element and a transistor.

\* \* \* \* \*